United States Patent
Harada et al.

(10) Patent No.: US 8,274,836 B2
(45) Date of Patent: Sep. 25, 2012

(54) NONVOLATILE SEMICONDUCTOR MEMORY DEVICE AND NONVOLATILE SEMICONDUCTOR MEMORY SYSTEM

(75) Inventors: Yoshikazu Harada, Kanagawa-ken (JP); Norihiro Fujita, Kanagawa-ken (JP); Masaki Fujiu, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 84 days.

(21) Appl. No.: 13/010,165

(22) Filed: Jan. 20, 2011

(65) Prior Publication Data

US 2011/0188319 A1   Aug. 4, 2011

(30) Foreign Application Priority Data

Jan. 29, 2010   (JP) .................................. 2010-019693

(51) Int. Cl.
*G11C 16/06* (2006.01)

(52) U.S. Cl. .............................. 365/185.22; 365/185.17

(58) Field of Classification Search ............. 365/185.22, 365/185.17, 185.24
See application file for complete search history.

(56) References Cited

U.S. PATENT DOCUMENTS

| | | | |
|---|---|---|---|
| 6,285,597 B2 * | 9/2001 | Kawahara et al. | 365/185.24 |
| 6,643,188 B2 | 11/2003 | Tanaka et al. | |
| 7,796,439 B2 * | 9/2010 | Arai et al. | 365/185.22 |
| 2011/0075486 A1 * | 3/2011 | Liao et al. | 365/185.18 |

* cited by examiner

*Primary Examiner* — Anh Phung
(74) *Attorney, Agent, or Firm* — Oblon, Spivak, McClelland, Maier & Neustadt, L.L.P.

(57) ABSTRACT

A nonvolatile semiconductor memory device and a nonvolatile memory system having a unit which suppresses erroneous reading of a nonvolatile semiconductor memory device of a multi-level memory system are provided. In the nonvolatile semiconductor memory device and the nonvolatile memory system of the multi-level memory system, a first verify voltage is used when data is written before a packaging process, and the verify voltage is switched to a second verify voltage lower than the first verify voltage when data is written after the packaging process.

5 Claims, 9 Drawing Sheets

NONVOLATILE SEMICONDUCTOR MEMORY DEVICE AND NONVOLATILE SEMICONDUCTOR MEMORY SYSTEM

CROSS-REFERENCE TO RELATED APPLICATION

This application is based upon and claims the benefit of priority from the prior Japanese Patent Application No. 2010-19693, filed on Jan. 29, 2010 the entire contents of which are incorporated herein by reference.

BACKGROUND OF THE INVENTION

1. Field of the Invention

The present invention relates to a nonvolatile semiconductor memory device and a nonvolatile memory system which are configured using electrically rewritable nonvolatile memory cells.

2. Description of the Related Art

An EEPROM (Electronically Erasable and Programmable Read Only Memory) is mounted in various pieces of equipment as an electrically rewritable nonvolatile semiconductor memory device. Recently, various kinds of multi-level memory systems in each of which one nonvolatile memory cell (hereinafter, may be referred to merely as a "memory cell") memorizes multi-bit data are proposed in order to realize capacity enlargement (see, for example, a patent document 1). The multi-level memory system divides an extensive voltage region ranging from a low voltage region to a high voltage region into many voltage regions, and uses the divided voltage regions as threshold values of the memory cell. When the threshold value is set in a higher voltage region, writing needs to be carried out by a higher writing voltage.

When a solder or others is used in a packaging process of fixing the semiconductor memory device like this to a package, a stress by high temperature about 200° C. may be exerted on the semiconductor memory device. An erroneous reading fault that data written into the semiconductor memory device before the packaging process cannot correctly be read after the packaging process because of passing through the high temperature process may be caused. It is considered that the erroneous reading fault like this is caused because a part of charge upon being written into the semiconductor memory device leaks because of a stress by high temperature and a threshold value written into a cell is lowered compared with that just after the writing. For this reason, it is required to take measures considering that the threshold value of the written data is lowered in the packaging process. In addition, a similar erroneous reading fault tends to easily arise because of advance of micronization as well as the multi-level memory system, and the measures are required.

BRIEF SUMMARY OF THE INVENTION

The invention is a nonvolatile semiconductor memory device and a nonvolatile memory system, and provides a nonvolatile semiconductor memory device and a nonvolatile memory system including a unit which suppresses erroneous reading of data written before a thermal process.

A nonvolatile semiconductor memory device according to one embodiment of the invention includes: a memory cell array in which plural electrically rewritable nonvolatile memory cells are arranged; a voltage generation unit which generates plural voltages including a writing voltage and a verify voltage each of which is applied to the nonvolatile memory cell; and a control circuit which switches the verify voltage, wherein a first verify voltage is used when writing is carried out to the nonvolatile memory cell before a thermal process, and a second verify voltage lower than the first verify voltage is used when writing is carried out to the nonvolatile memory cell after the thermal process.

A nonvolatile memory system according to another embodiment of the invention includes: a memory cell array in which plural electrically rewritable nonvolatile memory cells are arranged; a voltage generation unit which generates plural voltages including a writing voltage and a verify voltage each of which is applied to the nonvolatile memory cell; a control circuit which switches the verify voltage; and a controller which inputs an external signal into the memory cell array, wherein a first verify voltage is used when writing is carried out to the nonvolatile memory cell before a thermal process, and a second verify voltage lower than the first verify voltage is used when writing is carried out to the nonvolatile memory cell after the thermal process.

BRIEF DESCRIPTION OF THE DRAWINGS

FIG. 5A is the threshold value distribution upon writing, and FIG. 5B is the threshold value distribution upon reading.

FIG. 6A is the threshold value distribution upon writing, and FIG. 6B is the threshold value distribution upon reading.

DETAILED DESCRIPTION OF THE INVENTION

One embodiment of the invention will hereinafter be explained in detail with reference to drawings. However, the invention can be carried out in various aspects, and is not to be construed as being limited to the contents described in the embodiment shown below.

(First Embodiment)

Figure 1:
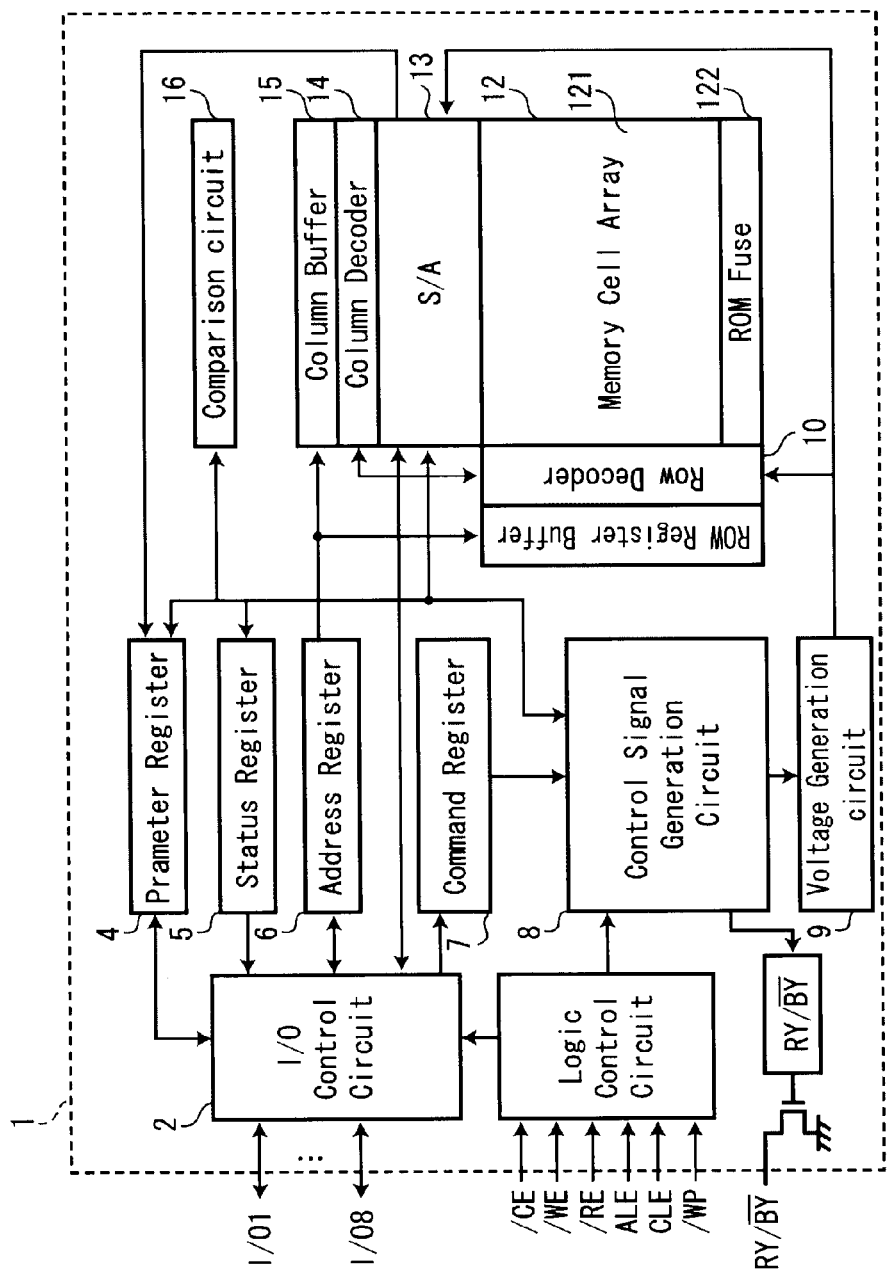
FIG. 1 is a view showing a functional block configuration of a memory chip of a NAND type flash memory in a first embodiment of the invention.
Figure 2:
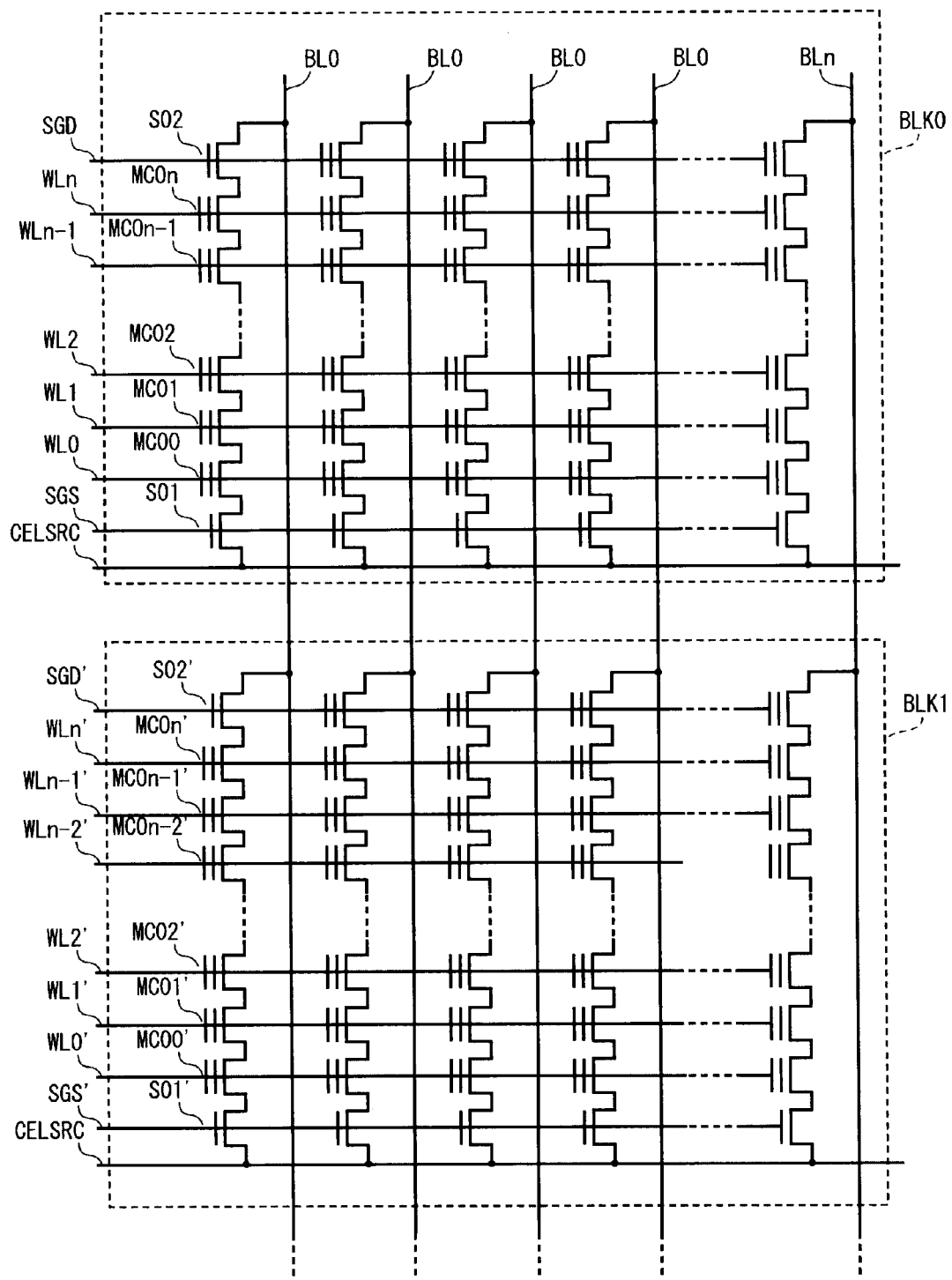
FIG. 2 is a view showing an array of memory cells of a memory cell array.

FIG. 1 shows a functional block configuration of a memory chip of a NAND type flash memory according to the first embodiment of the invention. FIG. 2 is a view showing an array of memory cells of a memory cell array 12. The memory cell array 12 is configured by arranging plural NAND cell units, as shown in FIG. 2. Each NAND cell unit has plural electrically rewritable nonvolatile memory cells (for example, MC00-MC0n) and selection gate transistors (for example, S01, S02) for connecting both ends of the memory cells to a source line CELSRC and a bit line BL respectively.

Control gates of the memory cells MC00-MC0n are connected to separate word lines WL0-WLn respectively. Gates of the selection gate transistors S01, S02 are connected to selection gate lines SGS, SGD parallel to the word lines respectively.

A set of the NAND cell units sharing a word line configures a block acting as a unit of data erasure. As shown in FIG. 2, plural blocks BLK0, BLK1, . . . are ordinarily arranged in the direction of the bit lines. A row decoder 10 includes a word line drive circuit which selects the word line of the memory cell array 12 and drives the word line.

A column decoder 14 selects the bit line. A sense amplifier circuit 13 is connected to the bit lines of the memory cell array 12, and has a function of writing and reading data through the sense amplifier circuit which holds input-output data temporarily and a data latch function of holding written data and read data.

When data is read, the data read to the sense amplifier circuit 13 is outputted to external input-output terminals I/01-I/08 through an I/O control circuit 2.

When data is written, the written data supplied to the input-output terminals I/01-I/08 from an external controller is loaded into the sense amplifier circuit 13 through the I/O control circuit 2.

A command supplied from the input-output terminals I/01-I/08 through the I/O control circuit 2 is decoded at a control signal generation circuit (an internal controller) 8 through a command register 7. External control signals such as a chip enable signal /CE, a write enable signal /WE, a read enable signal /RE, an address latch enable signal ALE, a command latch enable signal CLE are externally supplied to the control signal generation circuit 8 through a logic control circuit 3. The control signal generation circuit 8 carries out sequence control of writing and erasure of data and control of reading of data based on the external control signal and the command supplied depending on an operation mode.

A status register 5 informs various kinds of states in the chip outside. The status register 5 includes, for example, a ready/busy register which holds data showing which of a ready/busy status the chip is in, a writing status register which holds data showing pass/fail of writing, an erroneous writing status register which holds data showing presence or not of an erroneous writing status (pass/fail of erroneous writing verify), an over-writing status register which holds data showing presence or not of an over-writing status (pass/fail of over-writing verify), and others.

A ROM fuse 122 is formed by, for example, memory cells having the same structure as that of the memory cells in the memory cell array 12. Otherwise, the ROM fuse 122 may be formed in a region separate from the memory cell array 12. Otherwise, the ROM fuse 122 may be set in a part of the memory cell array 12. In FIG. 1, the memory cell array 12 is divided into the first memory area 121 and the second memory area. This first memory area 121 memorizes ordinary data, and the second memory area memorizes data separate from the ordinary data as the ROM fuse 122. Furthermore, the ROM fuse 122 can be configured with a metal fuse.

In the ROM fuse 122 shown in FIG. 1, initial setting data related to a writing operation is memorized. As the initial setting data to be memorized, there are the number of threshold levels, data related to the verify voltage depending on each threshold level, setting for switching the verify voltage depending on each threshold level, the number of step-ups of a writing voltage Vpgm for switching verify voltage depending on the threshold level, the verify voltage, and others.

These initial setting data on the writing operation to be memorized in the ROM fuse 122 or others may be programmed before shipment of the memory, or may be loaded into the data register/sense amplifier circuit 13 from the external controller (not shown) through the input-output terminals I/01-I/08 and the I/O control circuit 2, and be written in the ROM fuse 122 or others.

The memory cell array 12 and the row decoder 10 require various kinds of high voltages Vpp (the writing voltage Vpgm, the verify voltage Vr, a writing pass voltage Vpass, the reading voltage Vread, and others) depending on the operation mode. A voltage generation circuit 9 is provided for generating these high voltages Vpp. The voltage generation circuit 9 is controlled by the control signal generation circuit 8.

<Writing Operation>

Figure 3:
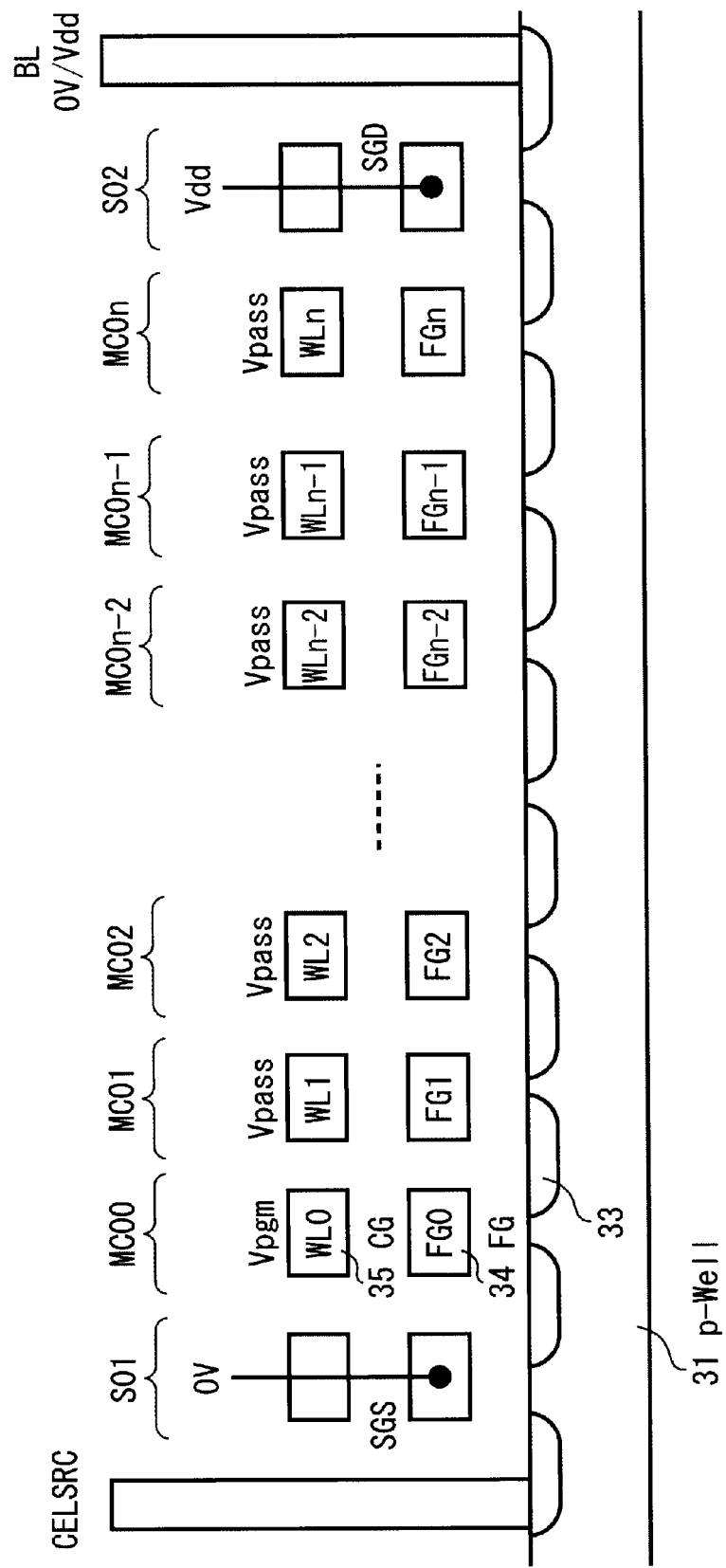
FIG. 3 is a sectional view showing one example of a configuration of a memory cell portion of the NAND type flash memory.

Next, the writing operation of the memory of the NAND type flash memory will be explained. FIG. 3 is a sectional view showing one example of a configuration of a memory cell portion of the NAND type flash memory. A base unit of the memory cell portion of the NAND type flash memory is configured with, for example, plural memory cells MC00-MC0n connected in series and two selection gate transistors S01 and S02, as shown in FIG. 3. The selection gate transistor S02 is connected to the bit line BL, and the selection gate transistor S01 is connected to the source line CELSRC common in the memory cell array. One memory cell has N-type diffused layers 33 formed on a p-type well (a p-Well) 31 as a source/drain, a control gate 35 connected to the word line WL, and a floating gate (FG) 34. An electron amount injected into this floating gate (FG) 34 is controlled by changing the writing voltage Vpgm applied to the word line and an application time thereof. A threshold value (Vt) of the memory cell changes depending on the electron amount injected into the floating gate (FG) 34. Accordingly, the threshold value (Vt) of the memory cell is controlled by the writing voltage Vpgm.

Figure 4:
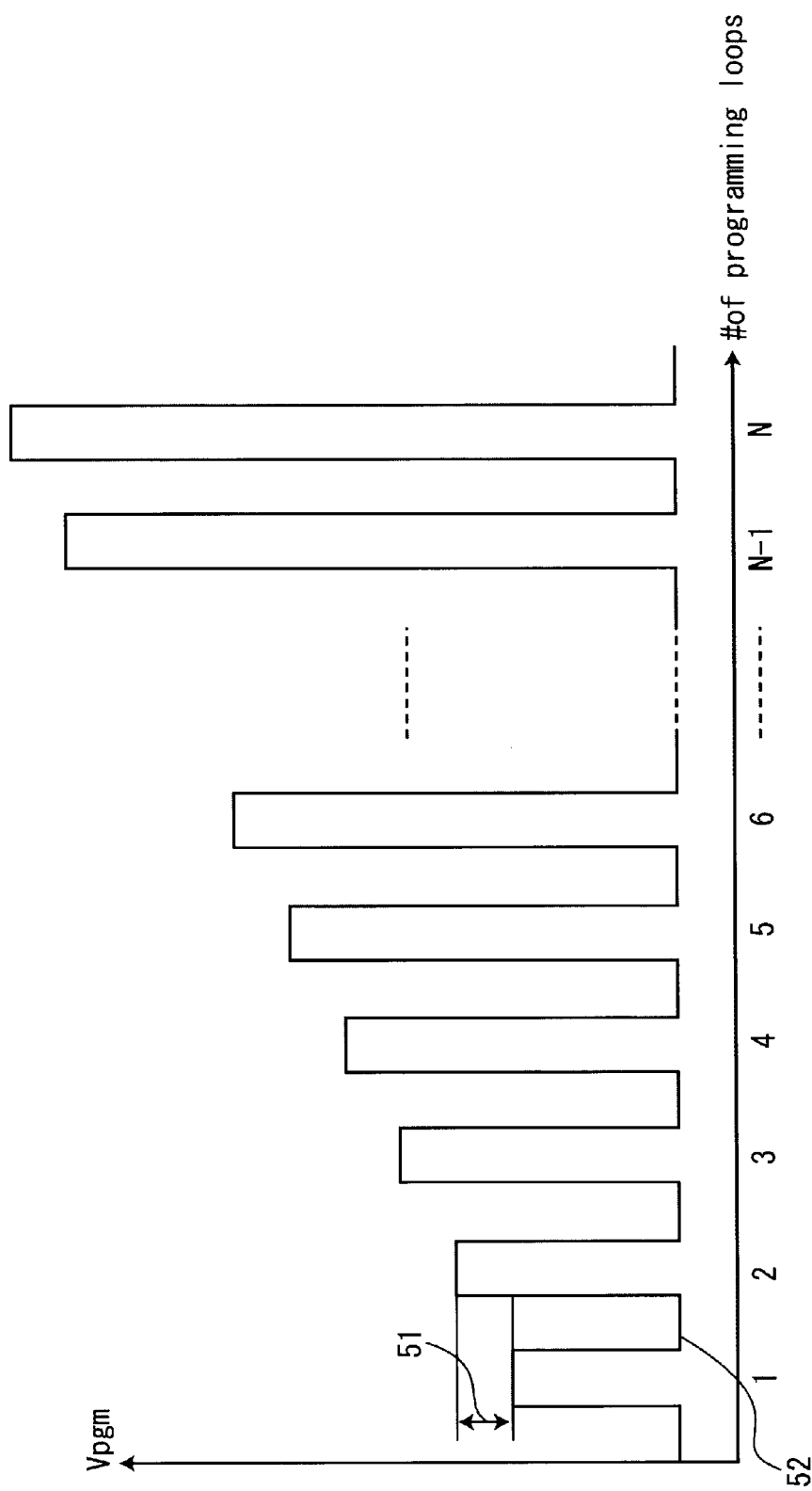
FIG. 4 is a circuit diagram showing one example of a voltage application condition when writing is carried out by selecting a word line WL0.

FIG. 4 is a view showing one example of a condition of voltage application to the NAND cell unit at the time of the writing operation. The writing voltage Vpgm is applied to a word line to be written, for example, WL0. A large number of memory cells are arranged along one word line WL0. The writing to a memory cell is carried out using one word line as a unit. In this specification, this word line to be written may be referred to as a "selected word line" for convenience.

The writing pass voltage Vpass is applied to the other non-selected word lines WL1-WLn, except WL0, not to be written.

The writing voltage Vpgm is applied to the selected word line WL0 while stepping up in pulsed system within a voltage of, for example, about 14V-20V so as to staying in a range of a threshold value corresponding to data to be written.

The selection gate transistor S02 disposed on the bit line BL0 side has a structure of an ordinary transistor which does not have the floating gate (FG). A voltage slightly lower than a power supply voltage Vdd is applied to a gate of the selection gate transistor S02. The selection gate transistor S01 on the source line side has the same structure as that of the selection gate transistor S02 on the bit line BL0 side. An electric potential of the gate of the selection gate transistor S01 is controlled to 0V.

As shown in FIG. 3, an electric potential of the bit line BL0 to be written is controlled to 0V through the sense amplifier circuit. When the threshold value of the memory cell along the selected word line as a target of the writing is set within an aimed threshold value range and the writing is completed, the electric potential of the bit line is controlled so as to become the power supply voltage Vdd through the sense amplifier circuit like the bit line BL1 shown in FIG. 3.

At the writing, 0V applied to the bit line BL0 is transferred up to a memory cell just before the selection gate transistor S01. For this reason, when the writing voltage Vpgm is applied to the selected word line WL0, the electric potential of the channel of the memory cell MC00 to be written becomes 0V and a potential difference of Vpgm is generated between the selected word line WL0 and the channel. By virtue of this potential difference, a Fowler-Nordheim (FN) tunneling current is generated, and electrons are injected into the floating gate (FG0) 34. By the injected electrons, distribution of the threshold value (Vt) of the memory cell MC00 shifts to the positive side. In contrast, the writing pass voltage Vpass of a level in which the Fowler-Nordheim (FN) tunneling current does not flow through is applied to the other non-selected word lines WL1-WLn, except WL0, not to be written. For this reason, the threshold value (Vt) distribution of the memory cells connected to the non-selected word lines hardly changes.

On the other hand, when the writing to a memory cell is completed or when the writing is not carried out to a memory cell, an electric potential of a bit line is controlled so as to become the power supply voltage Vdd through the sense amplifier circuit like the bit line BL1 in FIG. 3. In addition, a voltage slightly lower than Vdd is applied to a gate of a selection gate transistor S12. For this reason, the selection gate transistor S12 turns into a cutoff state. Channels of memory cells MC10-MC1n turn hereby into a floating state. When the Vpass or Vpgm is applied in this state to the word lines WL0-WLn, channel electric potentials of the memory cells MC10-MC1n are rise to, for example, about 8V. For this reason, the potential difference between the selected word line WL0 and the channel does not become large. That is, a state in which the FN tunneling current does not flow through is obtained, and the threshold value (Vt) distribution of the memory cells hardly shifts.

<Multi-level Writing Operation>

In the following, a data writing system which controls a memory operation of multi-level data by finely dividing a threshold value of one memory cell of a memory chip of the NAND type flash memory will be explained.

Amount of electrons injected into the floating gate (FG) 34 shown in FIG. 3 can be changed by controlling the writing voltage value applied to the word line and the application time thereof. The threshold voltage of the memory cell (hereinafter, may be referred to merely as a "threshold value") changes depending on the amount of electrons injected into the floating gate (FG) 34 shown in FIG. 3. Memory of the multi-level data can be realized by changing the threshold value (Vt) of this memory cell depending on data to be memorized. When data is written into a memory cell, the threshold value of the memory cell requires to be accurately controlled depending on the data to be written. For this reason, a writing method that, for example, a voltage applied to a control gate of the memory cell increases gradually is carried out. The writing method like this is referred to as a "step-up writing method".

<Step-up Writing Method>

Figure 5:
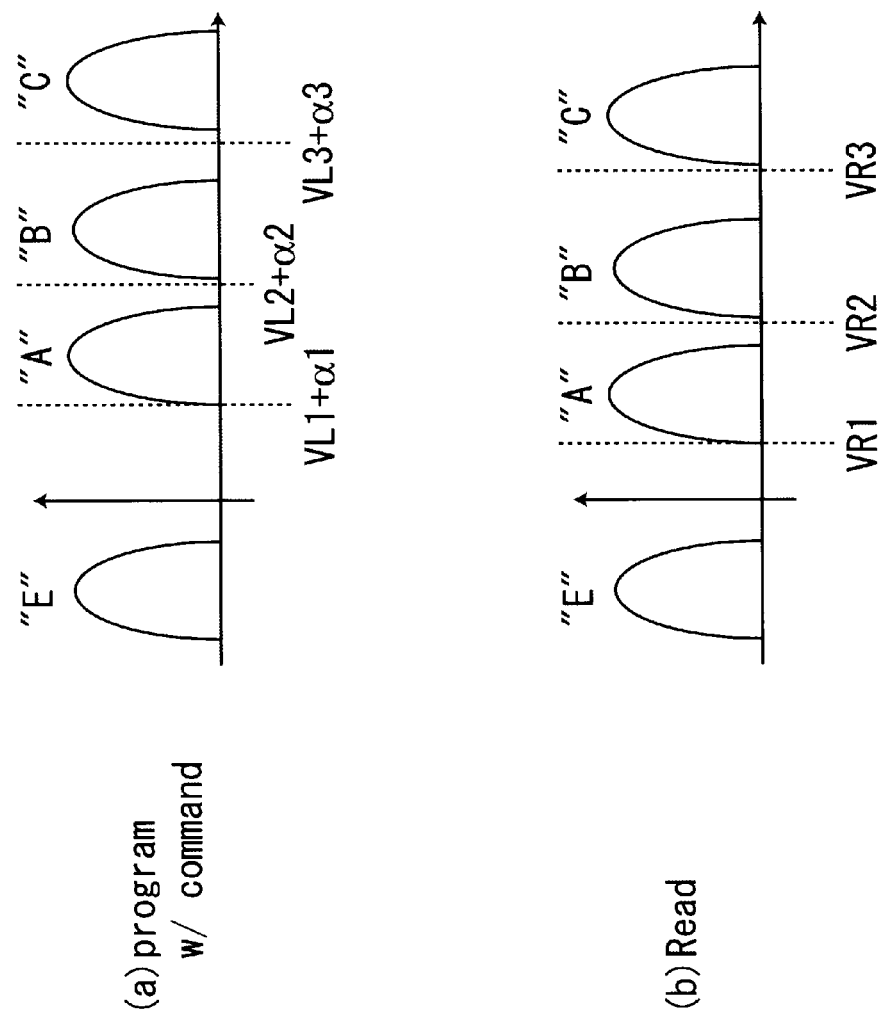
FIGS. 5A and 5B show a relationship among a writing voltage, a reading voltage and threshold value distribution when a first verify voltage after inputting a command is used.

FIG. 4 is a view showing one example of the step-up writing method. FIG. 4 shows that the writing voltage (Vpgm) applied to one word line is stepped up in a pulse form and is applied. The vertical axis shows the writing voltage (Vpgm), and the horizontal axis shows the number of times that the writing voltage (Vpgm) pulses are applied to a word line (the number of times of application of a writing voltage). A width 51 of each step-up of Vpgm is set at, for example, 0.2V. A value of an initial writing voltage pulse is set at, for example, 14V. The writing voltage pulse is then stepped up by 0.2V. Verification is carried out at the bottom 52 between the top and the top of the pulses, and although not shown in FIG. 5, a verify voltage is applied to a selected word line at this bottom 52.

<Verify Voltage>

The verify voltage applied at the verification is set as a voltage corresponding to a lower limit value of the threshold value distribution. In the multi-level memory system, a range where the threshold value should be distributed is set depending on the written data, and the verify voltage is set as a voltage corresponding to the lower limit value of the respective threshold value distribution. In the writing operation, when the threshold level of a memory cell to be written is beyond the verify voltage, the writing to the memory cell is completed. For this reason, an electric potential of a bit line which a NAND cell unit including the memory cell is connected to is controlled so as to become Vdd from 0V.

In the following, a case where multi-level data to be written into a memory cell is quaternary will be explained as an example. FIGS. 5A and 5B and FIGS. 6A and 6B are views showing distribution of threshold values of a quaternary memory cell. Groups of memory cells formed by distribution of four threshold values are referred to as LevelE, LevelA, LevelB and LevelC from the lower order of the threshold level for convenience in this specification.

Before a data writing operation, all the memory cells in a selected block are set in an erased state. For this reason, states of all the memory cells become a state of the lowest threshold value LevelE. When the threshold value of the memory cell is kept in LevelE, the writing is not carried out, and the state when the memory cell is erased is kept. In the step-up writing method, the writing is completed earlier from, for example, data of a lower threshold value. When data is memorized by dividing the threshold value of one memory cell into, for example, four levels, the writing is completed sequentially from LevelA of the lower threshold value to LevelB and LevelC.

However, since a thickness of a gate oxide, a coupling ratio and others vary for each memory cell, the memory cell cannot be set in the same threshold value range by the constant application number of the writing voltage. For this reason, the threshold value has a distribution width.

<Control of First Verify Voltage Before Thermal Process>

This embodiment is characterized in that, in the writing before the packaging, the verify voltage is controlled to a high value in accordance with a command inputted externally, and that the memory cell is written to a high threshold value by increasing the number of times of application of the step-up writing. A collective writing system of quaternary data as an example will hereinafter be explained. Incidentally, the first embodiment of the invention is not limited to the collective writing system of the quaternary data, but can be carried out also to multi-level data such as binary data, octal data and hexadecimal data. In addition, the first embodiment of the invention can be carried out not only in a system in which memory cells connected to all bit lines along a same word line are collectively written but also in a writing system, such as a bit line sealed system, in which memory cells along a same word line are written in separate several times. Furthermore, it can be carried out not only in a system in which data of all threshold levels except an erased state are collectively written into memory cells along a same word line but also in a system in which data of a specific threshold level is written earlier and data of other threshold level is written later.

FIGS. 5A and 5B show threshold value distribution which explains writing using the first verify voltage and reading before and after the packaging process respectively. FIG. 5A shows the threshold value distribution just after writing is carried out to each threshold level using the first verify voltage. $VL1+\alpha1$, $VL2+\alpha2$ and $VL3+\alpha3$ are used as the first verify voltage for LevelA, LevelB and LevelC respectively, by controlling the voltage generation circuit 9. Each of the verify voltages ($VL1+\alpha1$), ($VL2+\alpha2$) and ($VL3+\alpha3$) to be set can arbitrarily be set by controlling the voltage generation circuit 9. FIG. 5B shows reading voltages after writing by the verify voltages in FIG. 5A. It is supposed that this reading is performed after a thermal process such as the packaging. VR1, VR2 and VR3 are used for LevelA, LevelB and LevelC respectively. Each of the reading voltages VR1, VR2 and VR3 to be set can arbitrarily be set in a condition satisfying $VR1=(VL1+\alpha1)$, $VR2=(VL2+\alpha2)$ and $VR3=(VL3+\alpha3)$. That is, the writing is carried out using slightly higher verify voltages by supposing beforehand a shift of the threshold value distribution after the packaging process.

Figure 6:
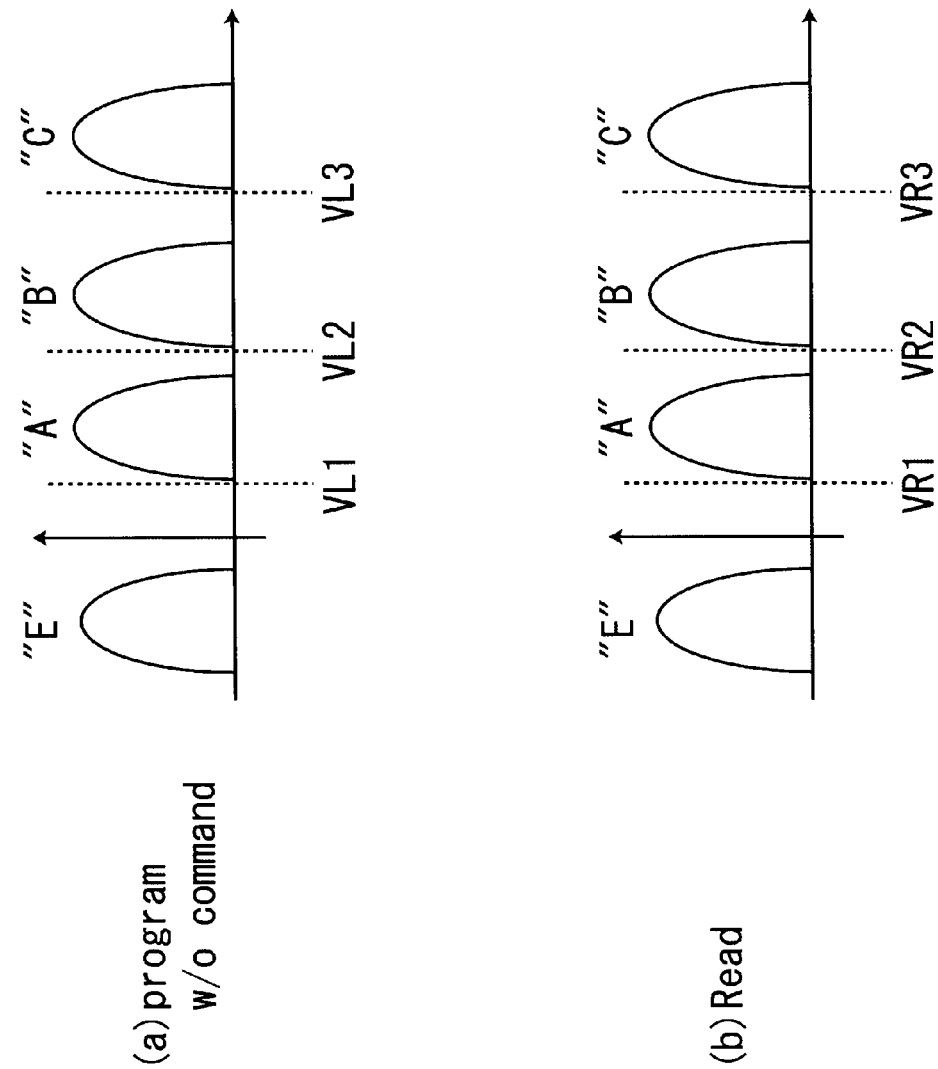
FIGS. 6A and 6B show a relationship among the writing voltage, the reading voltage and the threshold value distribution when a second verify voltage is used without inputting the command.

FIGS. 6A and 6B show threshold value distribution which explains writing using the second verify voltage and reading each carried out after the packaging process. FIG. 6A shows the threshold value distribution just after writing is carried out to each threshold level using the second verify voltage. VL1, VL2 and VL3 are used as the second verify voltage for LevelA, LevelB and LevelC respectively, by controlling the voltage generation circuit 9. The first verify voltage and the second verify voltage are set so as to satisfy an inequality relationship of $VL1=(VL1+\alpha1)$, $VL2=(VL2+\alpha2)$ and $VL3=(VL3+\alpha3)$. FIG. 6B shows reading voltages for FIG. 6A. VR1, VR2 and VR3 are used as the reading voltages like FIG. 5B. That is, in the first verification and the second verification, although the verify voltages upon writing are different, VR1, VR2 and VR3 set by LevelA, LevelB and LevelC respectively can be used upon reading. By using the method like this, it is not required to control the reading voltage with considering the shift of the threshold value distribution after the packaging process.

Incidentally, the first embodiment of the invention is not limited to the relationships shown in FIGS. 5A and 5B and FIGS. 6A and 6B, and various variations can be applicable. For example, $\alpha1=\alpha2?\alpha3$ may be adopted, and $\alpha1?\alpha2=\alpha3$ may be adopted. In addition, one verify voltage may include plural levels, and only LevelC may include plural levels.

<Flow Chart>

Figure 7:
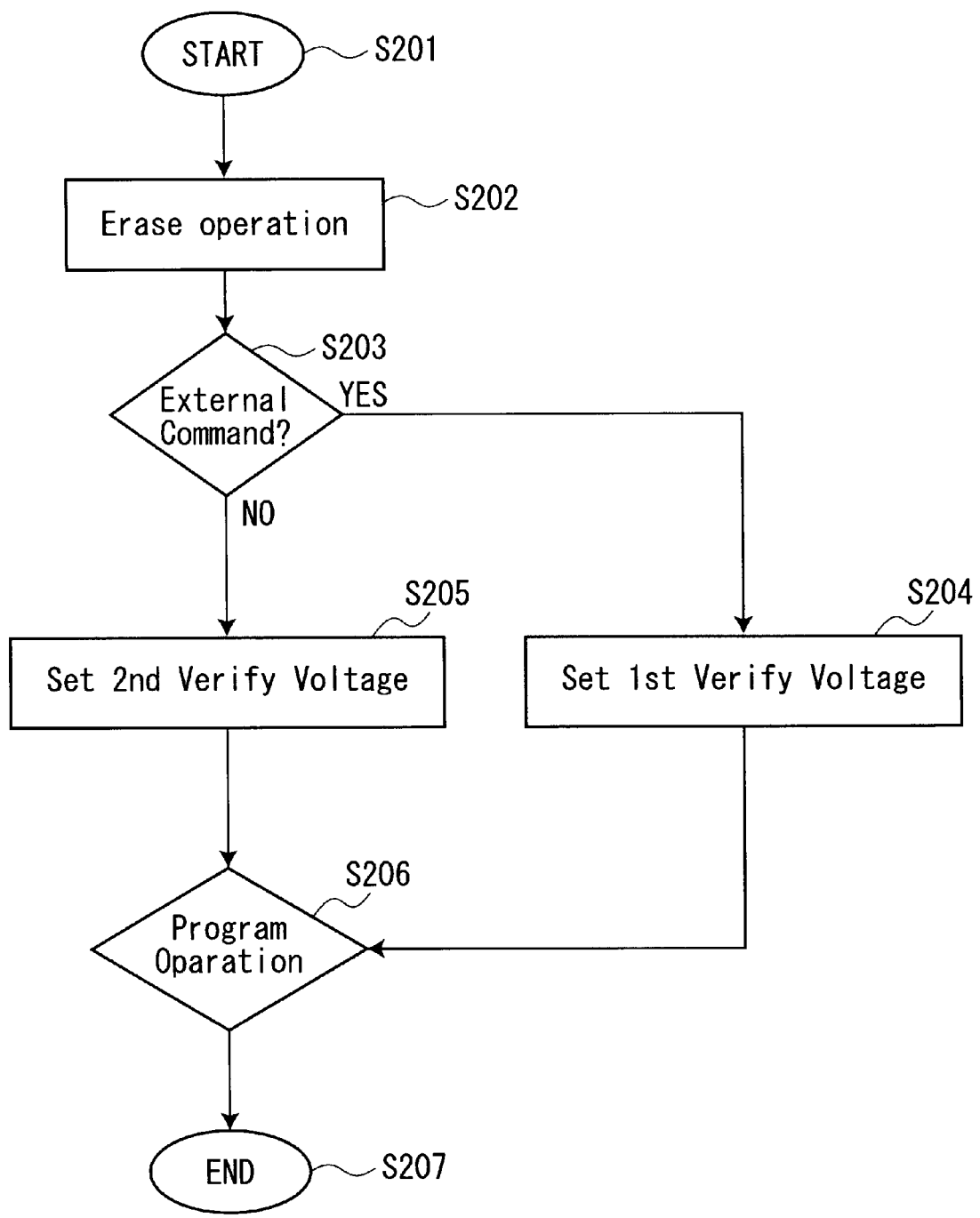
FIG. 7 is a flow chart of the first embodiment.

Next, a configuration of a unit to realize the methods shown in FIGS. 5A and 5B and FIGS. 6A and 6B will be explained using a flow chart of FIG. 7. FIG. 7 shows a flow chart which explains a flow of a process when a nonvolatile semiconductor memory device in the first embodiment of the invention writes data into a memory cell. When started as a step of S201, memory cells are set in an erased state as a step of S202. The threshold value level at this point corresponds to LevelE. Next, presence or not of an external command is checked as a step of S203. When there is the external command, the first verify voltage is decided, and is controlled by a control circuit, as a step of S204. A writing operation is carried out using this verify voltage at a step of S206.

On the other hand, when there is not the command in the step of S203, the second verify voltage is decided, and is controlled by the control circuit, as a step of S205. The writing operation is carried out using this verify voltage at the step of S206.

These verify voltages are memorized beforehand in, for example, the ROM fuse region 122, and are read and controlled by the control signal generation circuit 8.

According to the first embodiment of invention described above, in the nonvolatile semiconductor memory device of the multi-level memory system, the writing can be carried out using the first verify voltage set slightly higher beforehand when there is a high temperature process such as the packaging after the writing, and the writing can be carried out by the second verify voltage set slightly lower than the first verify voltage when there is not a thermal process after the writing. An external command can be used for this control.

Hereby, an influence of the shift of the threshold value by the thermal process such as the packaging can be prevented, and reading can be carried out at a constant reading voltage level with high reliability.

(Other Embodiment)

Figure 8:
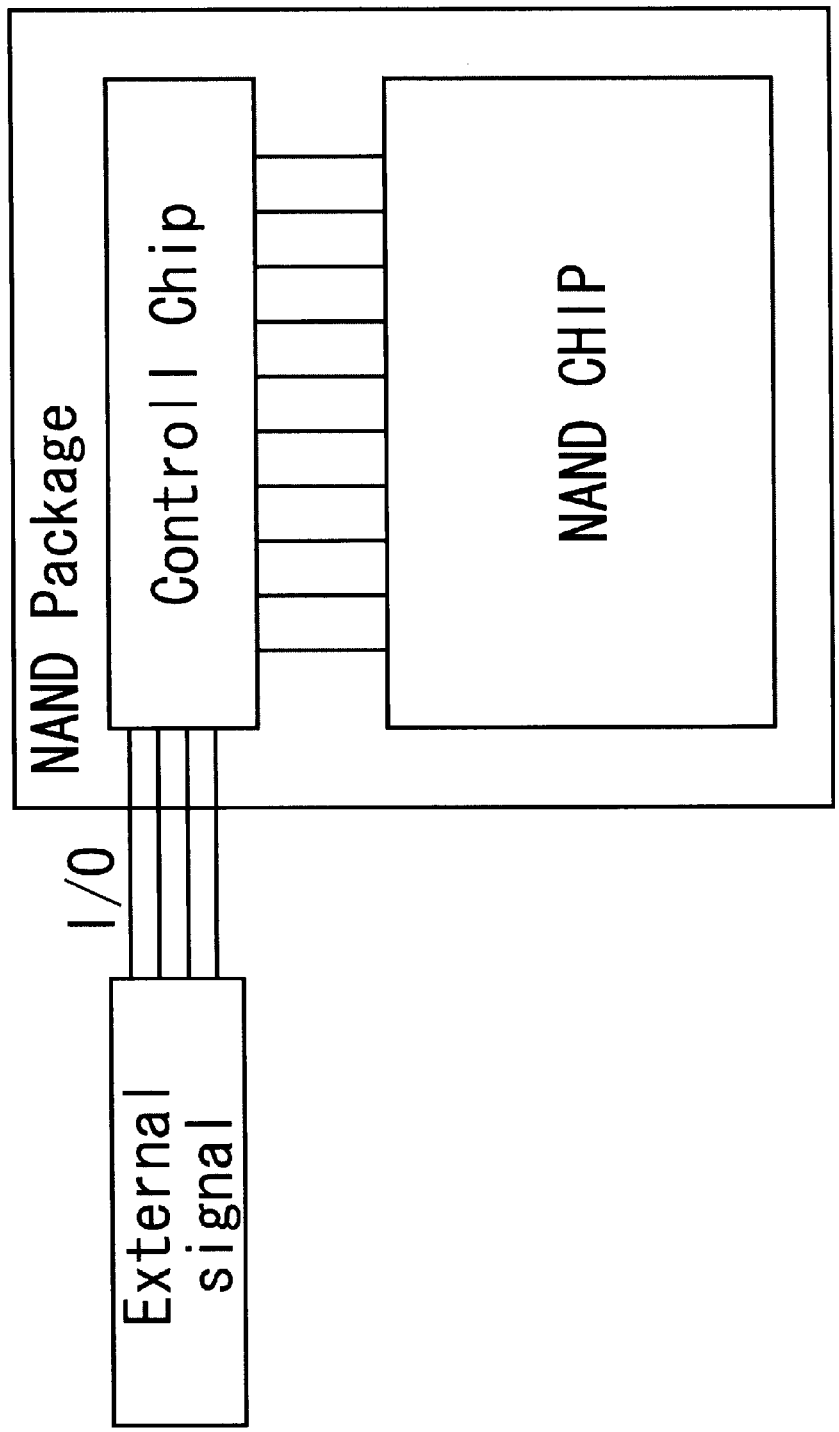
FIG. 8 is a configuration diagram of a nonvolatile memory system showing the first embodiment of the invention.
Figure 9:
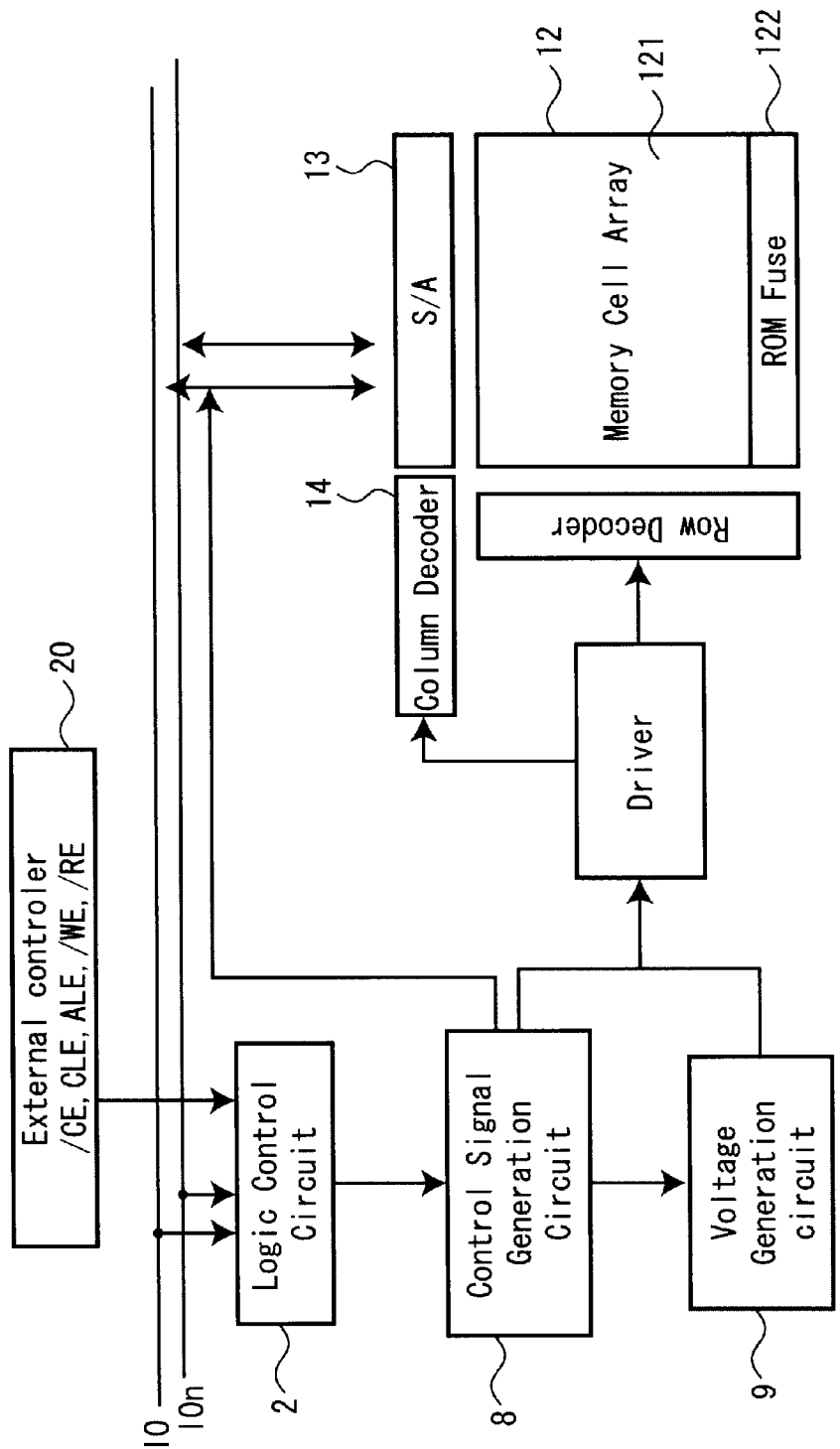
FIG. 9 is a configuration diagram of the nonvolatile memory system showing the first embodiment of the invention.

As has been stated first, the invention is not to be construed as being limited to the embodiment. For example, as shown in FIG. 8, the invention can be applied also to a nonvolatile memory system provided with a controller. As shown in FIG. 9, when a command is externally inputted, a signal is inputted through a command/address control circuit in the semiconductor memory device, and writing is carried out by the first verify voltage controlled by a voltage control circuit. When writing is carried out after the chip and the controller is then packaged at once, the writing is carried out by the second verify voltage read from the ROM fuse.

Also in this case, when writing is carried out before a thermal process of the packaging, the writing can be carried out by the first verify voltage higher than or equal to the second verify voltage when writing after the packaging is carried out.

In addition, although the embodiment has been explained using the NAND memory, the invention can similarly be applied also to a nonvolatile memory device and a nonvolatile memory system such as a three dimension memory, a PRAM and a ReRAM as well as the NAND memory.

What is claimed is:

1. A nonvolatile semiconductor memory device comprising:
   a memory cell array in which plural electrically rewritable nonvolatile memory cells are arranged;
   a voltage generation unit which generates plural voltages including a writing voltage and a verify voltage each of which is applied to the nonvolatile memory cell; and
   a control circuit which switches the verify voltage, wherein
   a first verify voltage is used when writing is carried out to the nonvolatile memory cell before a thermal process, and
   a second verify voltage lower than the first verify voltage is used when writing is carried out to the nonvolatile memory cell after the thermal process.

2. The nonvolatile semiconductor memory device according to claim 1, wherein
   plural threshold levels corresponding to plural written data are selectively set in the memory cell array,
   the control circuit switches different verify voltages depending on the plural threshold levels, and
   the control circuit controls amount of variation of the voltage upon switching between the first verify voltage and the second verify voltage so as to change depending on the plural threshold levels.

3. The nonvolatile semiconductor memory device according to claim 1, wherein
   the first verify voltage and the second verify voltage are switched in the control circuit by an externally inputted command.

4. A nonvolatile memory system comprising:
   a memory cell array in which plural electrically rewritable nonvolatile memory cells are arranged;

a voltage generation unit which generates plural voltages including a writing voltage and a verify voltage each of which is applied to the nonvolatile memory cell;

a control circuit which switches the verify voltage; and a controller which inputs an external signal into the memory cell array, wherein a first verify voltage is used when writing is carried out to the nonvolatile memory cell before a thermal process, and a second verify voltage lower than the first verify voltage is used when writing is carried out to the nonvolatile memory cell after the thermal process.

5. The nonvolatile memory system according to claim 4, wherein the memory cell and the controller are electrically connected before the thermal process.

* * * * *